United States Patent
Yang et al.

(10) Patent No.: US 11,320,322 B2
(45) Date of Patent: May 3, 2022

(54) TEMPERATURE SENSOR EVALUATION METHOD

(71) Applicant: Winbond Electronics Corp., Taichung (TW)

(72) Inventors: Hsuan-Jen Yang, Hsinchu (TW); Ting-Han Huang, Zhubei (TW)

(73) Assignee: WINBOND ELECTRONICS CORP., Taichung (TW)

(*) Notice: Subject to any disclaimer, the term of this patent is extended or adjusted under 35 U.S.C. 154(b) by 440 days.

(21) Appl. No.: 16/378,973

(22) Filed: Apr. 9, 2019

(65) Prior Publication Data

US 2020/0326244 A1   Oct. 15, 2020

(51) Int. Cl.
*G01K 7/00* (2006.01)
*G01K 15/00* (2006.01)
(Continued)

(52) U.S. Cl.
CPC .......... *G01K 15/007* (2013.01); *G01K 1/026* (2013.01); *G11C 11/40626* (2013.01); *G01K 7/00* (2013.01)

(58) Field of Classification Search
CPC ... G11C 16/26; G11C 16/28; G11C 11/40626; G01K 7/425; G01K 15/00; G01K 3/005; G01K 7/00; G01K 7/01; G01K 7/015; G01K 7/16; G01K 15/007; G01K 1/026; G01K 2219/00; G01K 15/005; G01K 7/22; G01K 1/02; G01K 1/028; G01K 13/20; G01K 3/14; G01K 7/14; G01K 7/21; G01K 2215/00; G01K 3/06; G01K 7/245; G01K 7/25; G01K 7/34; G01K 7/346; G01K 7/42; G01K 1/024; G01K 1/16; G01K 13/00; G01K 2205/00; G01K 2205/04;
(Continued)

(56) References Cited

U.S. PATENT DOCUMENTS 7,383,149 B1 * 6/2008 Walker ............... G01R 31/2874
702/127
7,397,721 B2 * 7/2008 Lee ........................ G11C 5/148
365/226
(Continued)

FOREIGN PATENT DOCUMENTS

JP          3811194 B2 *  8/2006  ................ G06J 1/00
KR    200380060372 A  *  7/2008
KR      20130042373 A  *  4/2013  ........... G11C 29/021

*Primary Examiner* — Gail Kaplan Verbitsky
(74) *Attorney, Agent, or Firm* — Muncy, Geissler, Olds & Lowe, P.C.

(57) ABSTRACT

A temperature sensor evaluation method is mentioned. The temperature sensor is arranged in a memory device and includes a comparator, a voltage divider and a band gap reference voltage source. The comparator compares a temperature reference voltage that varies with temperature with a plurality of divided voltages generated by the voltage divider. The evaluation method for a plurality of predetermined testing temperatures includes changing the plurality of divided voltages of the voltage divider, using the comparator to compare the divided voltages with the temperature reference voltage to determine the first detection voltage, and based on the voltage difference between a target divided voltage and the first detection voltage, retrieving the value of a temperature error between the sensing temperature of the temperature sensor and the testing temperature.

8 Claims, 3 Drawing Sheets

(51) Int. Cl.
 *G01K 1/02* (2021.01)
 *G11C 11/406* (2006.01)
(58) Field of Classification Search
 CPC ........ G01K 2207/06; G01K 7/02; G01K 7/18;
  G01K 7/206; G01K 7/24; G01K 7/343;
  G01R 1/203; G01R 19/00; G01R 31/382;
  G01R 1/20; G01R 15/146; G01R 17/00;
  G01R 19/0092; G01R 19/32
 See application file for complete search history.

(56) References Cited

U.S. PATENT DOCUMENTS

| | | | |
|---|---|---|---|
| 7,570,107 B2* | 8/2009 | Kim | G05F 3/30 327/539 |
| 7,720,627 B1* | 5/2010 | Walker | G01R 31/2874 702/130 |
| 7,969,795 B2* | 6/2011 | Lee | G11C 5/145 365/189.09 |
| 8,259,513 B2* | 9/2012 | Ogiwara | G11C 5/147 365/189.09 |
| 8,283,609 B2* | 10/2012 | Jeong | G01K 7/015 219/512 |
| 10,297,299 B2* | 5/2019 | Lee | G11C 16/3418 |
| 10,573,394 B2* | 2/2020 | Pan | G11C 11/5642 |
| 10,996,115 B2* | 5/2021 | Walker | G01K 7/01 |
| 2008/0159043 A1* | 7/2008 | Lee | G11C 5/145 365/226 |
| 2011/0169552 A1* | 7/2011 | Jeong | G11C 11/40615 327/512 |
| 2012/0033707 A1* | 2/2012 | Sloan | G01N 29/14 374/102 |
| 2012/0195138 A1* | 8/2012 | Son | G11C 7/04 365/189.07 |
| 2017/0147019 A1* | 5/2017 | Kim | G11C 29/56012 |
| 2017/0206954 A1* | 7/2017 | Lee | G11C 13/0033 |
| 2017/0254707 A1* | 9/2017 | Hyun | G01K 7/015 |
| 2018/0197587 A1* | 7/2018 | Lee | G11C 16/08 |
| 2018/0277223 A1* | 9/2018 | Hosoya | G11C 16/26 |
| 2019/0080740 A1* | 3/2019 | Takahashi | G11C 29/021 |

* cited by examiner

TEMPERATURE SENSOR EVALUATION METHOD

CROSS REFERENCE TO RELATED APPLICATIONS

Field of the Present Invention

The present disclosure relates to a temperature sensor, and especially to a temperature sensor evaluation method.

Description of the Related Art

In order to save power, a dynamic random access memory (DRAM) has different self-refresh frequencies at different temperatures. The lower the temperature, the lower the self-refresh frequency that can be implemented. That is, the self-refresh is at a longer time interval. The higher the temperature, the higher the self-refresh frequency that can be implemented. That is, the self-refresh is at a shorter time interval. The DRAM adjusts the self-refresh frequency at different temperatures based on the sensing temperature of a temperature sensor inside itself. If the discrepancy between the temperature sensed by the temperature sensor and the actual temperature is too large, the data stored in the DRAM may be lost due to an inappropriate self-refresh frequency.

When evaluating the actual sensing temperature of the temperature sensor, for the previous test environment method, the temperature sensor is put into a test environment with a specific temperature (for example, 90 degrees Celsius), and after the heat balances, the temperature of the test environment is adjusted up or down. For example, the temperature of the test environment is adjusted 2, 4, 6, or even 8 degrees Celsius up or down from the specific temperature to find a temperature point at which the temperature sensor switches the self-refresh frequency. However, every time the temperature of the test environment is adjusted, it takes about 2 hours for the heat balance, which causes the temperature sensor to have low testing efficiency. The actual sensing temperature of the temperature sensor has a resolution of only ±3 degrees Celsius. In other words, if the temperature point at which the temperature sensor switches the self-refresh frequency is within ±2 degrees Celsius of the specific temperature, the temperature point cannot be effectively detected during testing.

BRIEF SUMMARY OF THE PRESENT INVENTION

In order to resolve the issue described above, the present invention discloses a temperature sensor evaluation method, wherein the temperature sensor is arranged in a memory device. The memory device comprises a comparator, a voltage divider, a diode, and a band gap reference voltage source. The band gap reference voltage source powers the voltage divider and the diode. The comparator compares the temperature reference voltage (which varies with the temperature generated by the diode) with a plurality of divided voltages generated by the voltage divider. The evaluation method for a plurality of predetermined testing temperatures comprises a first testing temperature which is higher than a setting temperature. The evaluation method comprises calibrating the band gap voltage source with a target voltage; using the voltage divider to output the divided voltages in accordance with the target voltage; using the comparator to compare the divided voltages with the temperature reference voltage to get a first target divided voltage that corresponds to the first testing temperature (the first target divided voltage corresponds to the first of the divided voltages); changing the first divided voltage of the plurality of divided voltages from the voltage divider, and using the comparator to compare the first divided voltage with the temperature reference voltage to get a first testing voltage that corresponds to the first testing temperature; and getting a first temperature error between the actual sensing temperature from the temperature sensor and the first testing temperature in accordance with the voltage difference between the first target divided voltage and the first testing voltage.

Under a second testing temperature (which is lower than the setting temperature), the temperature sensor evaluation method disclosed above further comprises using the comparator to compare the plurality of divided voltages with the temperature reference voltage to get a second target divided voltage that corresponds to the second testing temperature, wherein the second target divided voltage corresponds to a second divided voltage; changing the second divided voltage from the voltage divider; using the comparator to compare the second divided voltage with the temperature reference voltage to get a second testing voltage that corresponds to the second testing temperature; and getting a second temperature error between the actual sensing temperature from the temperature sensor and the second testing temperature in accordance with the voltage difference between the second target divided voltage and the second testing voltage.

According to the temperature sensor evaluation method disclosed above, the method further comprises getting the actual sensing temperature of the temperature sensor in accordance with the voltage-temperature variation rate (slope) of the temperature reference voltage.

The temperature sensor evaluation method disclosed above further comprises evaluating the concentration (consistency) of the actual sensing temperature of the temperature sensor in each of a plurality of memories in accordance with the known actual sensing temperature of the temperature sensor. The memory is the one in the plurality of memories.

According to the temperature sensor evaluation method disclosed above, when the plurality of divided voltages are equal to the temperature reference voltage under the first testing temperature, the first divided voltage is set as the first target divided voltage; and when the first divided voltage after being changed is equal to the temperature reference voltage, the first divided voltage is set as the first testing voltage.

According to the temperature sensor evaluation method disclosed above, when the plurality of divided voltages are equal to the temperature reference voltage under the second testing temperature, the second divided voltage is set as the second target divided voltage; and when the second divided voltage after being changed is equal to the temperature reference voltage, the second divided voltage is set as the second testing voltage.

The temperature sensor evaluation method disclosed above further comprises adjusting the positive temperature coefficient circuit block and/or the negative temperature coefficient circuit block in the band gap reference voltage source.

The temperature sensor evaluation method disclosed above further comprises using a laser repair device under the first testing temperature (which is higher than the setting temperature) to cut a fuse in the positive temperature coefficient circuit block and/or the negative temperature coefficient circuit block in the band gap reference voltage source in accordance with the first target divided voltage, making the sensing temperature of the temperature sensor to be close to the first testing temperature.

According to the temperature sensor evaluation method disclosed above, the band gap reference voltage outputs a constant current that passes through the diode to generate a temperature reference voltage that varies with temperature; and the voltage-temperature variation slope can be changed by adjusting the value of the constant current.

According to the temperature sensor evaluation method disclosed above, the setting temperature is 90 degrees Celsius.

DETAILED DESCRIPTION OF DISCLOSURE

The present invention can be more fully understood by reading the subsequent detailed description with references made to the accompanying figures.

It should be understood that the figures are not drawn to scale in accordance with standard practice in the industry. In fact, it is allowed to arbitrarily enlarge or reduce the size of devices for clear illustration.

Figure 1:
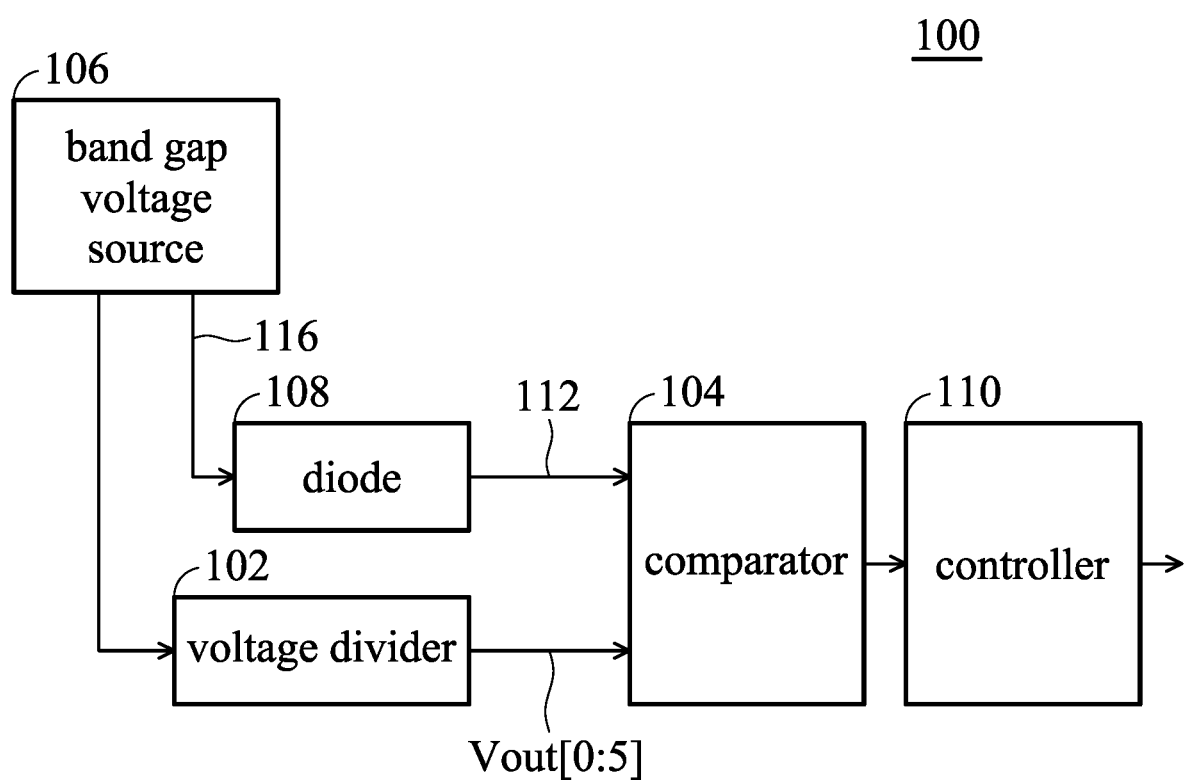
FIG. 1 is a block diagram of a temperature sensor 100 in accordance with an embodiment of the disclosure.

FIG. 1 is a block diagram of a temperature sensor 100 in accordance with an embodiment of the disclosure. As shown in FIG. 1, a temperature sensor 100 in a memory device or an integrated circuit (such as a DRAM) includes a voltage divider 102, a comparator 104, a band gap reference voltage source 106, a diode 108, and a controller 110. The voltage divider 102 generates a plurality of divided voltages Vout[0:n] in accordance with the voltage provided by the band gap reference voltage source 106. For example, the number n is 5 and the plurality of divided voltages Vout[0:5] includes a total of six divided voltages Vout[0]~Vout[5]. The band gap reference voltage source 106 also outputs a constant current 116 that passes through a diode 108 to generate a temperature reference voltage 112 that varies with temperature. The comparator 104 compares the temperature reference voltage 112 that varies with temperature with the plurality of divided voltages Vout[0:5] from the voltage divider 102 to detect the temperature of the test environment where the temperature sensor 100 is located. The controller 110 can control the self-refresh frequency of the memory in accordance with a comparison result from the comparator 104.

The voltage divider 102 has an impedance member that can adjust voltages of the plurality of divided voltages Vout[0:5]. For example, the voltage divider 102 has a variable resistance that can adjust the resistance value, or an adjustable impedance network (not shown) with a switch, a fuse, and a resistor to change the voltages of the plurality of divided voltages Vout[0:5] by following the voltage divider rule. An evaluation method of the temperature sensor 100 includes (for a plurality of predetermined testing temperatures, under a first testing temperature which is higher than a setting temperature such as 90 degrees Celsius) calibrating the band gap voltage source 106 to a target voltage, outputting the plurality of divided voltages Vout[0:5] in accordance with the target voltage using the voltage divider 102, and using the comparator 104 to compare the plurality of divided voltages Vout[0:5] with the temperature reference voltage 112 to get a first target divided voltage corresponding to the first testing temperature. The first target divided voltage corresponds to the first divided voltage Vout[5].

Figure 2:
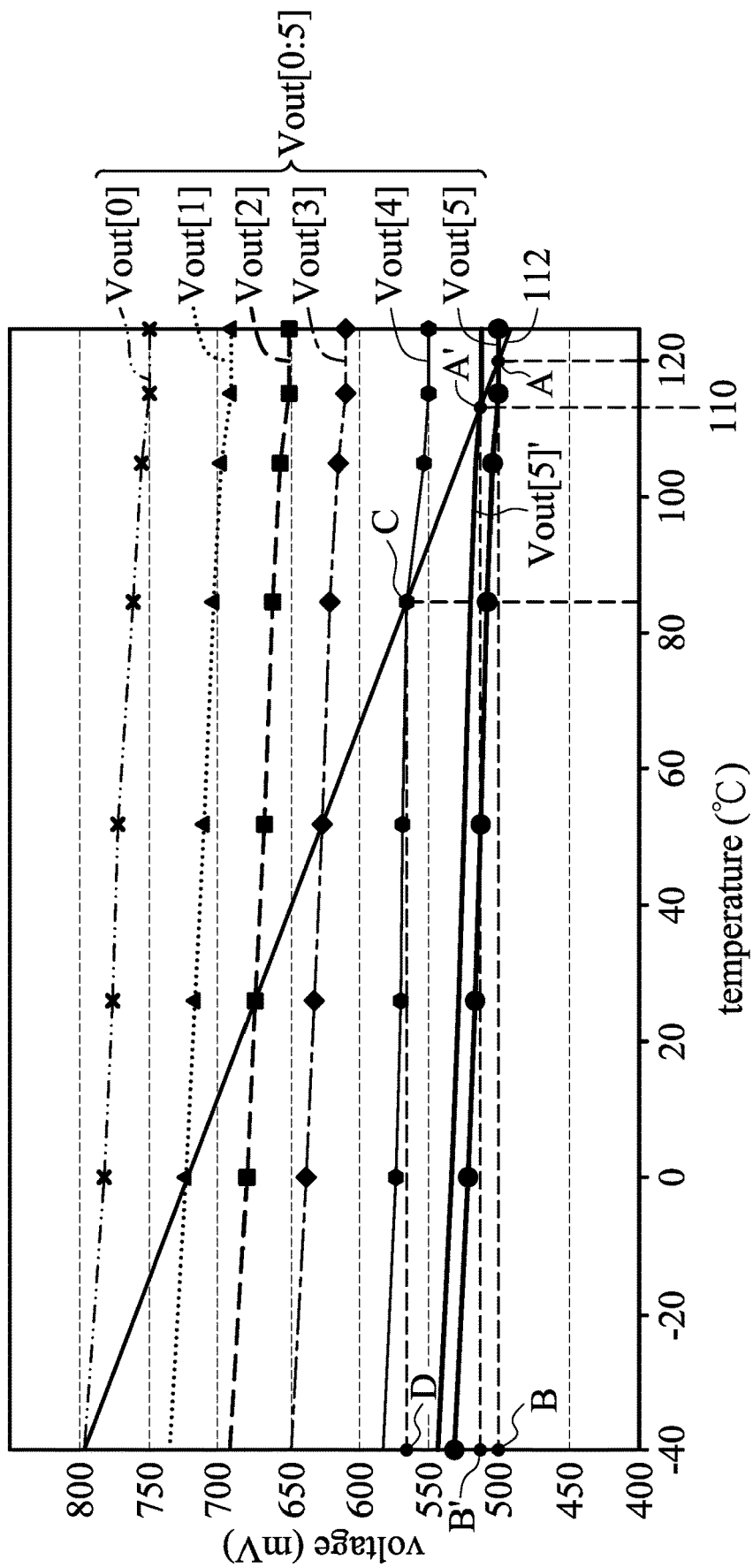
FIG. 2 is a voltage-temperature graph of a temperature reference voltage 112 and a plurality of divided voltages Vout[0:5] in accordance with the embodiment of the disclosure.

FIG. 2 is a voltage-temperature graph of a temperature reference voltage 112 and a plurality of divided voltages Vout[0:5] in accordance with the embodiment of the disclosure. As shown in FIG. 2, for example, under a test environment with a temperature that is higher than 90 degrees Celsius, 90 degrees Celsius and 120 degrees Celsius are selected as the testing temperatures for the temperature sensor 100. First, under a testing temperature of 120 degrees Celsius (that is, the memory is under a test environment of 120 degrees Celsius), the band gap voltage source 106 is calibrated to a target voltage, and the comparator 102 compares the plurality of divided voltages Vout[0:5] with the temperature reference voltage 112 to get a first target divided voltage that corresponds to the first testing temperature. At 120 degrees Celsius, by changing the first divided voltage Vout[5], the intersection point (which is point A) of the first divided voltage Vout[5] and the temperature reference voltage 112 may be determined. At point A, the first divided voltage Vout[5] is equal to the temperature reference voltage 112, and the first target divided voltage corresponding to point A in 120 degrees Celsius is determined to be the voltage at point B, for example, which is about 500 mV. At 90 degrees Celsius, by changing the second divided voltage Vout[4], the intersection point (which is point C) for the second divided voltage Vout[4] and the temperature reference voltage 112 may be determined. At point C, the second divided voltage Vout[4] is equal to the temperature reference voltage 112, and a second target divided voltage corresponding to the point C at 90 degrees Celsius is determined to be the voltage at point D, for example, which is about 570 mV.

Generally, the band gap reference voltage source 106 has a positive temperature coefficient circuit block and a negative temperature coefficient circuit block. The circuit impedance in the positive temperature coefficient circuit block increases as the temperature rises. The circuit impedance in the negative temperature coefficient circuit block decreases as the temperature increases. In an embodiment, by adjusting the positive temperature coefficient circuit block and the negative temperature coefficient circuit block in the band gap reference voltage source 106, the plurality of divided voltages Vout[0:5] are calibrated, so that at a plurality of predetermined testing temperatures, the plurality of divided voltages Vout[0:5] do not suffer voltage drift due to temperature changes.

The band gap reference voltage source 106 outputs a constant current 116 that passes through the diode 108 to generate a temperature reference voltage 112 that varies with temperature. The voltage-temperature variation slope rate of the temperature reference voltage 112 can be changed by adjusting the value of the constant current 116 passing through the diode 108, and the sensitivity of the temperature sensor 100 can be improved. The value of the temperature reference voltage 112 decreases as the temperature increases. For example, by increasing the value of the constant current 116, the current flowing through the diode 108 becomes larger, the voltage-temperature variation slope of the temperature reference voltage 112 becomes larger, and the sensitivity of the temperature sensor 100 becomes better accordingly. The temperature reference voltage 112 is set based on the required sensitivity of the temperature sensor 100, or based on the voltage-temperature variation characteristics of the physical components. In the embodiment, the voltage-temperature variation slope of the temperature reference voltage 112 is the slope of the voltage across the diode 108 versus temperature (about −2 mV per degree Celsius).

The evaluation method of the temperature sensor 100 further comprises using a laser repair device (not shown), under a first testing temperature which is higher than the setting temperature, to cut one or more fuses in the positive temperature coefficient circuit block and/or the negative temperature coefficient circuit block in the band gap reference voltage source in accordance with the target divided voltages, making the sensing temperature of the temperature sensor 100 be close to the first testing temperature. For example, under a test environment of 120 degrees Celsius, the laser repair device cuts the fuse of the positive temperature coefficient circuit block and/or the negative temperature coefficient circuit block in accordance with the first target divided voltage (point B, 500 mV) in FIG. 2 to influence the voltage-temperature characteristics of the plurality of divided voltages Vout[0:5]. Different target divided voltages correspond to different fuses in the positive temperature coefficient circuit block and the negative temperature coefficient circuit block. Thus, under a test environment of 120 degrees Celsius, by cutting the corresponding fuse, the first divided voltage Vout[5] can be set as 500 mV at 120 degrees Celsius, thereby fixing the voltage of the first divided voltage Vout[5] at 120 degrees Celsius. The same action can be performed at other testing temperatures to adjust the plurality of divided voltages Vout[0:5]. In other words, the action of cutting the fuse under a test environment of 120 degrees Celsius calibrates the first divided voltage Vout[5], and the sensing temperature of the temperature sensor 100 can be close to the testing temperature of 120 degrees Celsius.

Then, under the first testing temperature which is higher than the setting temperature, the band gap reference voltage source 106 in the memory or temperature sensor 100 provides power to the voltage divider 102 and the diode 108, the plurality of divided voltages Vout[0:5] from the voltage divider 104 are changed, and then the comparator 104 compares the plurality of divided voltages Vout[0:5] with the temperature reference voltage 112 to get a first testing voltage that corresponds to the first testing temperature, thereby obtaining a first temperature error between the actual sensing temperature from the temperature sensor 100 and the first testing temperature in accordance with the voltage difference between the first target divided voltage and the first testing voltage.

For example, under a temperature of the test environment which is higher than 90 degrees Celsius, 90 degrees Celsius and 120 degrees Celsius are selected as testing temperatures for the temperature sensor 100. As shown in FIG. 2, under a test environment of 120 degrees Celsius, the band gap voltage source 106 is first calibrated to a target voltage, and the voltage divider 102 outputs the plurality of divided voltages Vout[0:5] in accordance with the target voltage. The intersection point (which is point A') between the first divided voltage Vout[5]' and the temperature reference voltage 112 is determined by changing the plurality of divided voltages Vout[0:5], such as by changing the value of the first divided voltage Vout[5] under a range of 500 mV±20 mV (changing Vout[5] to Vout[5]' in FIG. 2). At point A', the first divided voltage Vout[5]' of the plurality of divided voltages is equal to the temperature reference voltage 112, and a first testing voltage corresponding to point A' is determined to be point B'. The first testing voltage B' is about 520 mV. The difference between the first target divided voltage B (500 mV) and the first testing voltage B' is 20 mV. Because it is known that the voltage-temperature variation slope of the temperature reference voltage 112 is −2 mV per degree Celsius, the actual sensing temperature of the temperature sensor 100 is 10 degrees lower than the testing temperature of 120 degrees Celsius, which is 110 degrees Celsius (the sensing temperature of 110 degrees Celsius corresponding to point A' in FIG. 2). Similarly, under a test environment of 90 degrees Celsius, by changing the value of the second divided voltage Vout[4] under a range of 570 mV±20 mV, the intersection point between the changed second divided voltage (not shown) and the temperature reference voltage 112 is determined. Therefore, a second testing voltage of the temperature sensor 100 may be determined by changing the value of the second divided voltage Vout[4] of the plurality of divided voltages.

After determining each testing voltage at each corresponding first testing temperature, the temperature error between the actual sensing temperature obtained by the temperature sensor 100 and the corresponding first testing temperature is determined in accordance with the voltage difference between the target divided voltage and the testing voltage. For example, under a test environment of 120 degrees Celsius, if the target divided voltage is 570 mV, and the testing voltage is 580 mV, the voltage difference between the target divided voltage and the testing voltage is 10 mV. If the voltage-temperature variation rate of the temperature reference voltage 112 is −2 mV per degree Celsius, the actual sensing temperature of the temperature sensor 100 is 5 degrees lower than the temperature of the test environment. In other words, the actual sensing temperature of the temperature sensor 100 is 115 degrees Celsius.

At a testing temperature of 120 degrees Celsius, for example, by changing the plurality of divided voltages Vout[0:5] during the testing of the temperature sensor 100, it is not necessary to adjust the real temperature of the test environment from 115 degrees to 125 degrees Celsius. The time it takes for the heat to balance is eliminated, and the testing efficiency of the temperature sensor 100 is improved. The testing voltage is also used to accurately determine the actual sensing temperature of the temperature sensor 100 to set a self-refresh period of the memory that corresponds to the actual sensing temperature.

In the embodiment, after determining the testing voltage at each first testing temperature that is higher than the setting temperature, the controller 110 retrieves the actual sensing temperature of the temperature sensor 100 via the temperature error, and further determines the self-refresh period, and then updates the self-refresh period of the memory. For example, as shown in FIG. 2, at point A, the first divided voltage Vout[5] corresponding to 120 degrees Celsius is 500 mV, so a corresponding self-refresh period of 16 ms is set. At point C, the second divided voltage Vout[4] corresponding to 90 degrees Celsius is 570 mV, so a corresponding self-refresh period of 64 ms is set. In other words, according to the settings described above, the self-refresh period of the memory is 16 ms under a test environment with a temperature that is higher than 120 degrees Celsius, and the self-refresh period of the memory is 32 ms under a test environment with a temperature that is higher than 90 degrees Celsius but lower than 120 degrees Celsius. Therefore, the goal of having different self-refresh periods that depend on different temperatures can be achieved.

After finishing the evaluation of the temperature sensor 100 in a test environment that is hotter than the setting temperature, testing is continued under a test environment that is cooler than the setting temperature (at a low temperature or room temperature, for example), to obtain a second testing voltage that corresponds to each second testing temperature. The second testing temperatures are lower than the first testing temperatures. The measurement method of the testing voltages has been described in previous paragraphs, and is therefore not described again.

For the original evaluation method of the temperature sensor 100, the concentration of the temperature sensor 100 is evaluated by taking each temperature sensor in a plurality of memories within a range of ±2 and ±4 degrees Celsius from each testing temperature. In other words, a total of 5 temperature points are taken at each corresponding testing temperature to evaluate the concentration of the actual sensing temperature of each temperature sensor in each memory. The evaluation method of the temperature sensor 100 disclosed in the present invention can reduce the waiting time for heat to balance at the 4 aforementioned temperature points (±2 and ±4 degrees Celsius), wherein each temperature point need two hours of heat-balance time, so that a total of 80% of the evaluation time is saved. Because the variation slope of the voltage across the diode 108 versus temperature is about −2 mV per degree Celsius, the actual sensing temperature of the temperature sensor 100 can be calculated more accurately, and the concentration of the actual sensing temperature between each temperature sensor in each of the memories can be evaluated.

Figure 3:
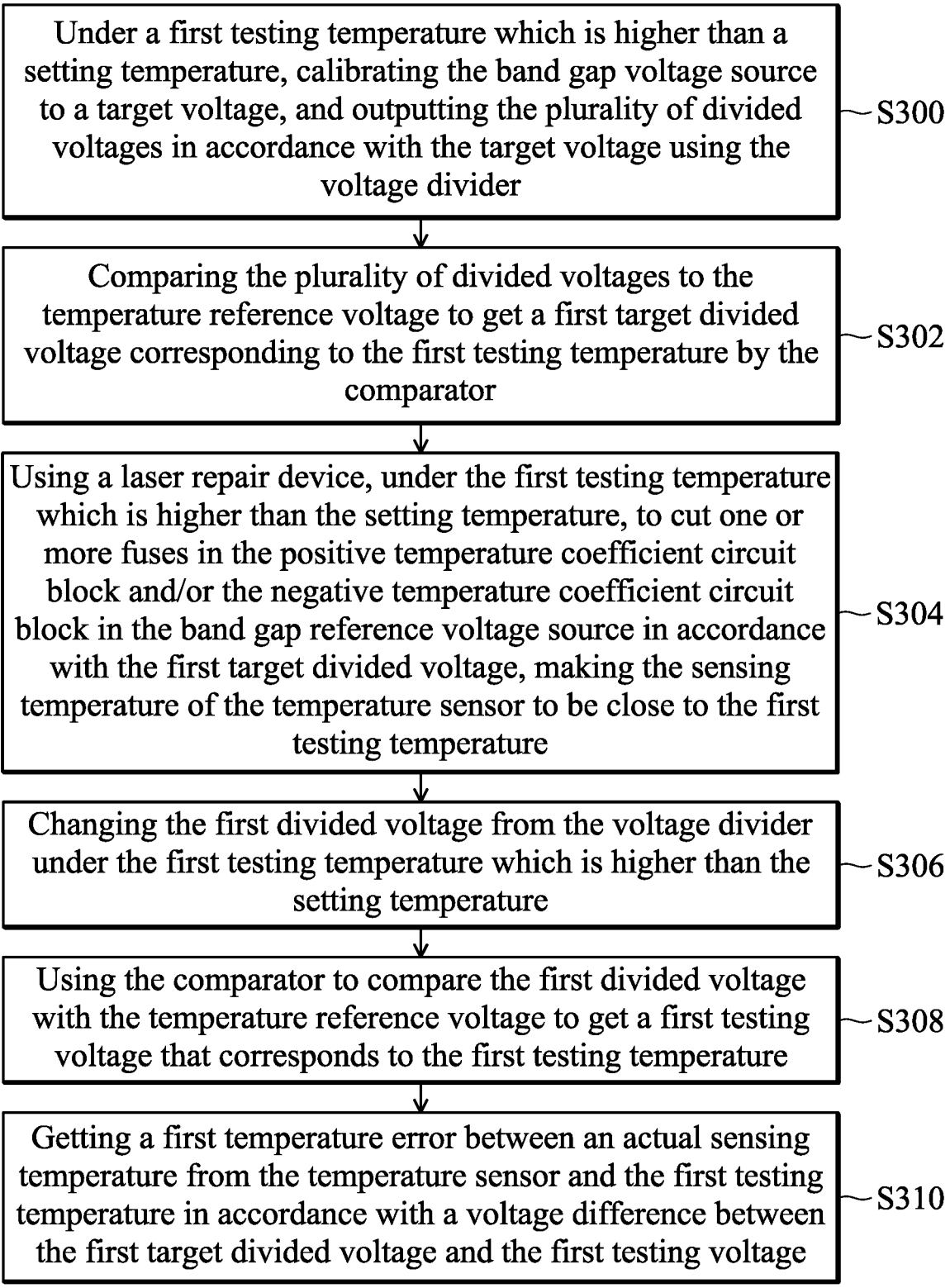
FIG. 3 is a flow chart of an evaluation method of the temperature sensor 100 in FIG. 1 in accordance with the embodiment of the disclosure.

FIG. 3 is a flow chart of an evaluation method of the temperature sensor 100 in FIG. 1 in accordance with the embodiment of the disclosure. As shown in FIG. 3, the band gap voltage source 106 is calibrated to a target voltage, and the plurality of divided voltages Vout[0:5] are output in accordance with the target voltage using the voltage divider 102 (S300); and the comparator 104 compares the plurality of divided voltages Vout[0:5] with the temperature reference voltage 112 to get a first target divided voltage corresponding to a first testing temperature (S302).

Then, under the first testing temperature which is higher than a setting temperature, a laser repair device is used to cut a fuse in the positive temperature coefficient circuit block and/or the negative temperature coefficient circuit block in the band gap reference voltage source 106 in accordance with the first target divided voltage, getting the sensing temperature of the temperature sensor 100 to be close to the first testing temperature (S304). After that, under the first testing temperature which is higher than the setting temperature, the method involves changing the first divided voltage Vout[5] from the voltage divider 102 (S306); using the comparator 104 to compare the first divided voltage Vout[5] to the temperature reference voltage 112 to get a first testing voltage that corresponds to the first testing temperature (S308); and getting a first temperature error between the actual sensing temperature from the temperature sensor 100 and the first testing temperature in accordance with the voltage difference between the first target divided voltage and the first testing voltage (S310). The actual sensing temperature of the temperature sensor 100 can be calculated more accurately by comparing the temperature error with the first testing temperature. The details of the above steps S300 to S310 have been described in previous paragraphs, and therefore are not described again.

The ordinal in the specification and the claims of the present invention, such as "first", "second", "third", etc., has no sequential relationship, and is just for distinguishing between two different devices with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A temperature sensor evaluation method, wherein the temperature sensor is arranged in a memory device, the temperature sensor comprises:
   a comparator,
   a voltage divider,
   a diode, and
   a band gap reference voltage source,
   the band gap reference voltage source powers the voltage divider and the diode, and the comparator compares a temperature reference voltage that varies with temperature generated by the diode with a plurality of divided voltages generated by the voltage divider;
   the evaluation method comprising:
   for a plurality of predetermined testing temperatures, in an environment with a first testing temperature which is higher than a setting temperature, setting the band gap reference voltage source to a target voltage, outputting the plurality of divided voltages in accordance with the target voltage using the voltage divider, comparing the plurality of divided voltages to the temperature reference voltage to get a first target divided voltage corresponding to the first testing temperature by the comparator; wherein the first target divided voltage corresponds to a first divided voltage in the plurality of divided voltages;
   changing the first divided voltage from the voltage divider, and using the comparator to compare the first divided voltage with the temperature reference voltage to get a first testing voltage that corresponds to the first testing temperature;
   getting a first temperature error between an actual sensing temperature from the temperature sensor and the first testing temperature in accordance with a voltage difference between the first target divided voltage and the first testing voltage; and
   calibrating the actual sensing temperature from the temperature sensor by the first temperature error;
   wherein the predetermined testing temperatures are environment temperatures when the evaluation method is performed;
   wherein the setting temperature is a predetermined temperature;
   wherein the actual sensing temperature is a temperature initially measured by the
   wherein the first divided voltage is changed by the voltage divider adjusting a resistance value of a variable resistance comprised in the voltage divider;
   wherein a band gap reference voltage outputs a constant current passing through the diode, whereby generating the temperature reference voltage that varies with temperature; and a voltage-temperature variation slope can be changed by adjusting a value of the constant current;
   wherein the voltage-temperature variation slope is the slope of the voltage across the diode versus temperature.

2. The temperature sensor evaluation method as claimed in claim 1, further comprising:
  at a second testing temperature which is lower than the setting temperature, using the comparator to compare the plurality of divided voltages with the temperature reference voltage to get a second target divided voltage that corresponds to the second testing temperature; wherein the second target divided voltage corresponds to a second divided voltage in the plurality of divided voltages;
  changing the second divided voltage from the voltage divider, and using the comparator to compare the second divided voltage with the temperature reference voltage to get a second testing voltage that corresponds to the second testing temperature;
  getting a second temperature error between the actual sensing temperature from the temperature sensor and the second testing temperature in accordance with a voltage difference between the second target divided voltage and the second testing voltage;
  calibrating the actual sensing temperature from the temperature sensor by the second temperature error;
  wherein the second divided voltage is changed by the voltage divider adjusting the resistance value of a variable resistance comprised in the voltage divider.

3. The temperature sensor evaluation method as claimed in claim 1, further comprising getting the actual sensing temperature of the temperature sensor in accordance with the voltage-temperature variation slope of the temperature reference voltage.

4. The temperature sensor evaluation method as claimed in claim 1, wherein in the environment with the first testing temperature, when the plurality of divided voltages are equal to the temperature reference voltage, setting the first divided voltage as the first target divided voltage; and when the first divided voltage after being changed is equal to the temperature reference voltage, setting the first divided voltage as the first testing voltage.

5. The temperature sensor evaluation method as claimed in claim 2, wherein in an environment with the second testing temperature, when the plurality of divided voltages are equal to the temperature reference voltage, setting the second divided voltage as the second target divided voltage; and when the second divided voltage after changing is equal to the temperature reference voltage, setting the second divided voltage as the second testing voltage.

6. The temperature sensor evaluation method as claimed in claim 1, wherein the band gap reference voltage source comprises a positive temperature coefficient circuit block and a negative temperature coefficient circuit block; wherein the method further comprises adjusting the positive temperature coefficient circuit block in the band gap reference voltage source and/or the negative temperature coefficient circuit block in the band gap reference voltage source.

7. The temperature sensor evaluation method as claimed in claim 6, further comprising using a laser repair device, in the environment with the first testing temperature which is higher than the setting temperature, to cut one or more fuses in the positive temperature coefficient circuit block and/or the negative temperature coefficient circuit block in the band gap reference voltage source in accordance with the first target divided voltage, making the sensing temperature of the temperature sensor to be close to the first testing temperature.

8. The temperature sensor evaluation method as claimed in claim 1, wherein the setting temperature is 90 degrees Celsius.

* * * * *